United States Patent [19]

Stach et al.

[11] Patent Number: 4,752,025

[45] Date of Patent: Jun. 21, 1988

[54] SURFACE MOUNT ASSEMBLY REPAIR TERMINAL

[75] Inventors: Steven R. Stach, Leander; Carl R. Scrogum, Richmond, both of Tex.

[73] Assignee: Austin American Technology, Austin, Tex.

[21] Appl. No.: 53,376

[22] Filed: May 22, 1987

[51] Int. Cl.$^4$ .................. B23K 37/04; B23K 29/00; B23K 3/04

[52] U.S. Cl. .......................... 228/9; 228/47; 228/56.5; 228/264; 228/191; 228/20; 269/73; 269/289 MR; 269/254 CS

[58] Field of Search ............. 228/9, 20, 47, 56.5, 228/180.2, 191, 264, 119, 19; 269/57, 58, 71, 73, 254 CS, 289 MR, 290

[56] References Cited

U.S. PATENT DOCUMENTS

| | | | |
|---|---|---|---|
| 3,359,583 | 12/1967 | Strube | 269/58 |
| 4,274,576 | 6/1981 | Shariff | 228/264 |
| 4,295,596 | 10/1981 | Doten et al. | 228/180 |
| 4,426,571 | 1/1984 | Beck | 219/373 |
| 4,463,636 | 8/1984 | Heller et al. | 269/254 CS |
| 4,552,300 | 11/1985 | Zovko et al. | 228/20 |
| 4,569,473 | 2/1986 | Guiliano | 228/264 |
| 4,585,351 | 4/1986 | Gronek et al. | 269/73 |
| 4,605,152 | 8/1986 | Fridman | 228/6.2 |
| 4,610,388 | 9/1986 | Koltuniak et al. | 228/6.2 |
| 4,620,659 | 11/1986 | Holdway | 228/20 |
| 4,626,205 | 12/1986 | Barkley et al. | 432/225 |

FOREIGN PATENT DOCUMENTS 2614246 10/1977 Fed. Rep. of Germany ........ 269/73
1187981 10/1985 U.S.S.R. ....................... 269/254 CS

OTHER PUBLICATIONS

IBM Technical Disclosure Bulletin, "Rework Fixture for Surface Mounted Components", vol. 29, No. 11, pp. 4718, 4719, Apr. 1987.
"More Than Just Hot Air," by Steve Stach and Jonas Aleksonis, Austin American Technology, Austin, Texas, Feb. 1987, Circuits Manufacturing, pp. 45–46, 48.
"A Revolution in IC Packaging", by T. J. Byers, May 1986, Radio-Electronics, pp. 59–62.

Primary Examiner—Nicholas P. Godici
Assistant Examiner—Samuel M. Heinrich
Attorney, Agent, or Firm—Gunn, Lee & Jackson

[57] ABSTRACT

A repair terminal is disclosed for reworking defective components on printed circuit boards. The terminal has a heater arm which lowers itself over the component, and directs hot gas thereon. A vacuum shroud surrounds the heat zone around the component and removes excess heat so as to minimize damage to surrounding components. The heater arm has inner and outer tubes, the inner tube delivering hot gas the outer tube removing it. Thus the outer tube prevents an operator from being burned by the dangerously hot temperature of the inner tube. A workholder is also disclosed for holding and aligning the circuit board with the heater arm. The workholder is capable of adjustment along the X- and Y-axes as well as in the theta orientation.

24 Claims, 5 Drawing Sheets

SURFACE MOUNT ASSEMBLY REPAIR TERMINAL

BACKGROUND OF THE INVENTION

1. Field of the Invention

The present invention generally relates to devices used to repair and replace electronic components, and more particularly to a device used to replace surface mounted components.

2. Description of the Prior Art

During the past forty years, society has been experiencing an explosion in electronics technology. As electronic circuits became more complicated, engineers had a harder time trying to fit all of the components into a relatively small package. This problem was greatly mitigated by the introduction of transistors, which replaced the obsolete vacuum tube. Later, when integrated circuits were invented, computers and other electronic devices became even smaller. Now we are on the verge of the next evolutionary step in electronics packaging that will reduce standard electrical circuits by an order of magnitude or more, that of surface mount technology.

The foundation of modern electronics lies in the integrated circuit (IC) known as the dual in-line package (DIP). A DIP typically has metal leads that protrude from two sides of the chip, extending through a printed circuit board (PCB), with solder welds on the opposite side of the board. This combination appears in virtually all types of electronic systems ranging from supercomputers to television sets. A close examination of a PCB reveals that today's space problem does not lie in the size of the chip, but rather in it connections to the supporting circuitry. Surface mount technology may well force the celebrated DIP to join the vacuum tube in the annals of history.

Surface mount technology (SMT) simply refers to components that are mounted directly onto the surface of the board, without leads penetrating to the opposite side. The advantages of SMT are obvious. Higher component density may be achieved, and components may even be mounted on both sides of the PCB. SMT is not really new, as it has been used for years in digital wristwatches and slim pocket calculators. However, it has been projected that by the year 1990, 75% of all electronic equipment in the world will be manufactured by surface mounting.

SMT devices are typically installed using reflow soldering. In that technique, flux containing granulated solder is placed between the PCB and the SMT component. The flux (as well as the PCB and components) is then heated by convection, infra-red radiation, or vapor-phase penetration. The solder melts, fixing the component to the board. Excess resin is then removed with a suitable solvent.

At the present time there are three different kinds of surface mounted IC's. Those are the small outline integrated circuit (SOIC), the plastic leaded chip carrier (PLCC), and the leadless ceramic chip carrier (LCCC). With regard to the present invention, these three chips basically differ only in their lead structure. The leads of the SOIC extend outwardly to lie flat on the PCB. This structure has been termed "gull-wing." The PLCC, by contrast, has inwardly extending J-shaped leads. The LCCC has no leads at all, but rather has metallic contacts molded in its ceramic body.

The present invention is directed to the replacement and repair of SMT components. Since these components are mounted flush with no structural support, unique tools will have to be devised to allow removal of the component. As far as IC's go, the SOIC is the only surface mounted chip that may be removed using conventional soldering methods. Even this would be extremely difficult, however, as great care must be taken to avoid reflow of adjacent components. Moreover, the industry appears to be endorsing PLCC devices over the SOIC, as the PLCC has a smaller "footprint."

One tool recently developed for SMT repair is the heated collet. The heated collet is a tweezer-type iron, similar to existing DIP desolderers in that it completely clamps around the component and heats the entire unit, melting the solder in the process. This has the obvious disadvantage of destroying heat sensitive elements surrounding the defective component. The exposed heating elements can also cause damage to the human operator. Furthermore, a separate collet is required for each package size.

The present invention deals with a hot gas system for reworking surface mounted components. Hot gas systems are known for desoldering conventional (non-surface mounted) components. Some of these are shown in the following patents:

| U.S. Pat. No. | Inventor(s) |
| --- | --- |
| 4,295,596 | Doten et al. |
| 4,426,571 | R. Beck |
| 4,552,300 | Zovko et al. |
| 4,605,152 | R. Fridman |
| 4,610,388 | Koltuniak et al. |
| 4,620,659 | J. Holdway |
| 4,626,205 | Barkley et al. |

Each of the devices shown in these patents, however, suffers from the same critical drawbacks as the heated collet-the hot gas conduit presents a safety hazard to technicians, and the gas has a tendency to melt or otherwise damage surrounding components. It would, therefore, be desirable and advantageous to devise a hot gas system capable of removing any type of surface-mounted components which would not injure either adjacent IC's or the user of the system. The device should also economically accommodate a wide variety of SMT component sizes.

SUMMARY OF THE INVENTION

Accordingly, the primary object of the present invention is to provide a tool for desoldering surface mounted components.

Another object of the invention is to provide such a device which would avoid heating the circuitry surrounding the defective component.

Still another object of the invention is to provide a surface mount repair terminal which may be employed by anyone, without the risk of serious bodily injury.

Yet another object of the invention is to provide a terminal for surface mount repair having a workholder which positions the circuit board in a proper orientation for replacement of the component.

The foregoing objects are achieved in a surface mount repair terminal having a novel gas flow control. Heat is directed through a conduit at the component leads or castellations only. A vacuum shroud enclosing the immediate heat zone conducts excess heat up and away through another conduit surrounding the first.

This design has the further benefit of removing noxious vapors produced during reflow. By means of this unique design, the exposed portion of the heater arm is kept below scorching temperatures, and the adjacent components are kept cool. Preheaters on the bottom of the board prevent thermal shock as well as assist the operation. The board itself is held in a unique workholder capable of adjustment in the x- and y-axes as well as theta-angle adjustment.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of illustrative embodiments when read in conjunction with the accompanying drawings, wherein:

DESCRIPTION OF THE PREFERRED EMBODIMENTS

Figure 1:
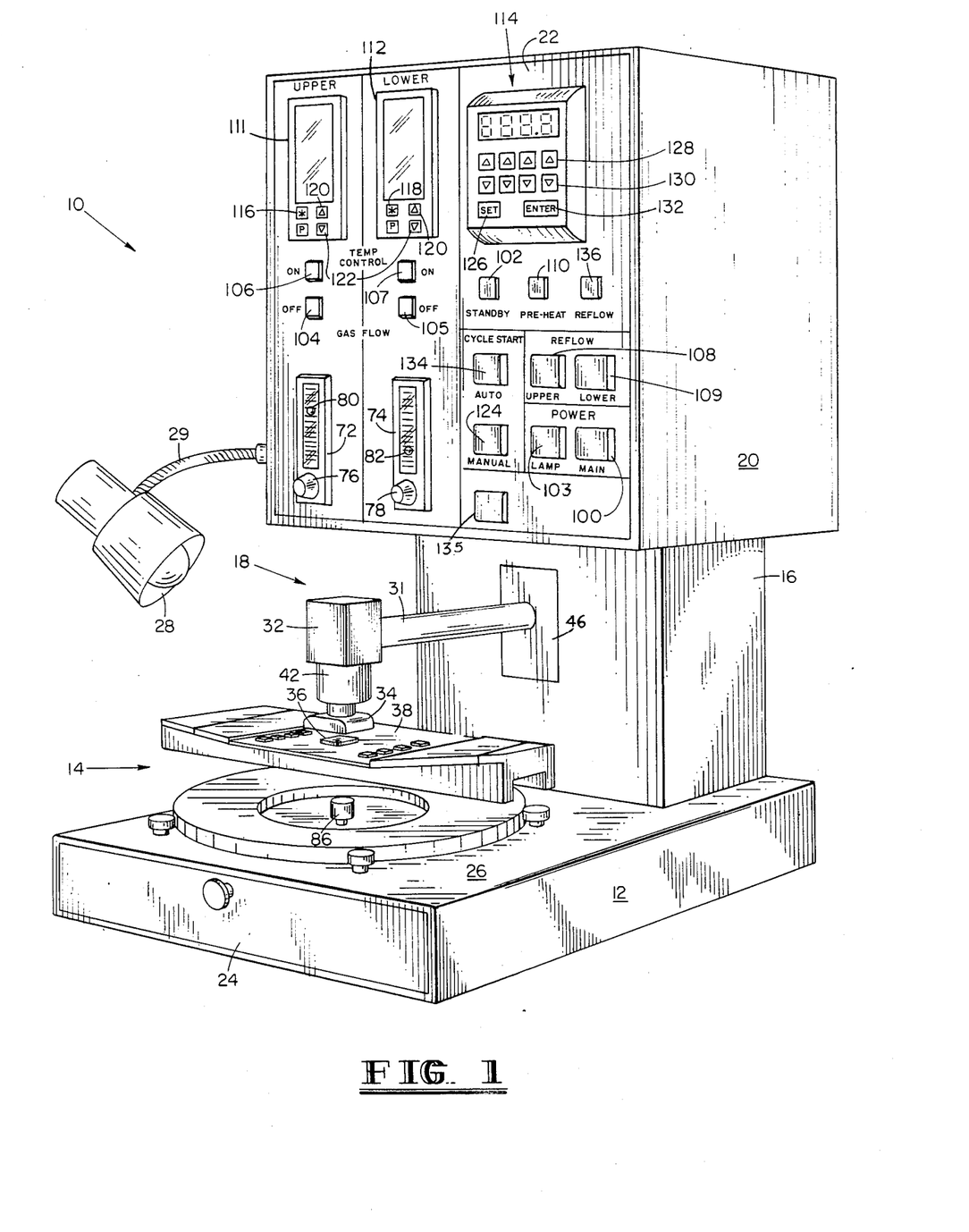
FIG. 1 is a perspective view showing the repair terminal of the present invention.

With reference now to the figures, and in particular with reference to FIG. 1, there is depicted a repair terminal 10 for reworking circuit boards or substrates populated with surface mounted components. Repair terminal 10 is generally comprised of base 12, workholder 14, support member 16, heater arm 18, housing 20, and control panel 22. In the preferred embodiment, repair terminal 10 has a width of approximately 14 inches, a length of approximately 24 inches, and a height of approximately 23 inches.

Base 12, support member 14, and housing 20 may be constructed of any rigid material such as steel. Base 12 has a drawer 24 therein which conveniently stores accessories for the device, such as clamps, tweezers, spare quartz nozzles, etc. Workholder 14 rests upon upper surface 26 of base 12. Workholder 14 is described in further detail below. Support member 16 also rests on surface 26, and in turn supports the heater arm mechanism 18 and housing 20. Housing 20 encloses the electrical control circuitry for the unit as well as a portion of the pneumatic system, both of which are described below in connection with FIGS. 4 and 5. A lamp 28 having a flexible but rigid support cable 29 may be provided to illuminate the work area.

Figures 2, 4:
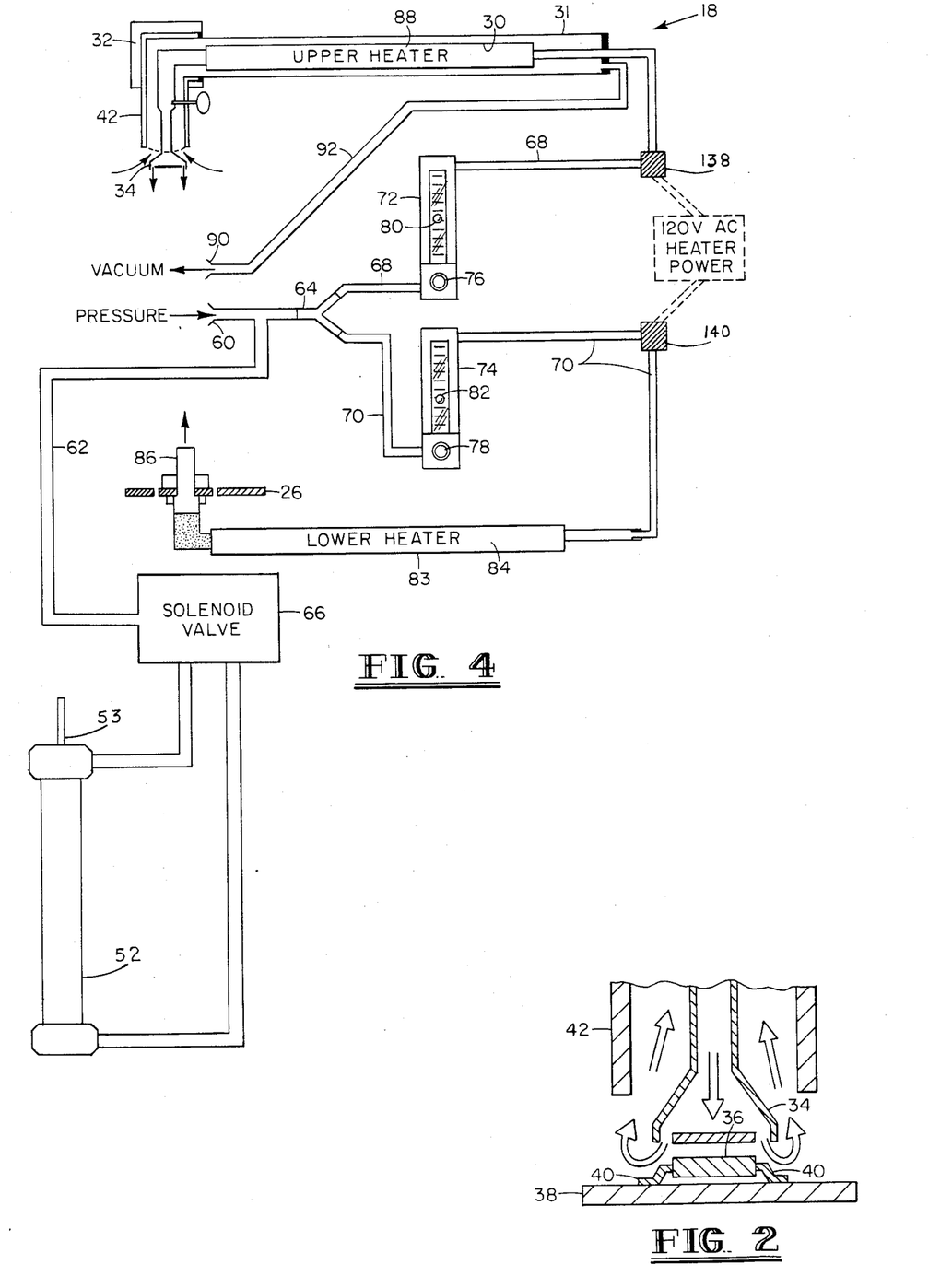
FIG. 2 is a cross-sectional view of the nozzle portion of the present invention showing the novel air-flow thereof.
FIG. 4 is a block diagram depicting the pneumatic system of the invention.
Figure 3A:
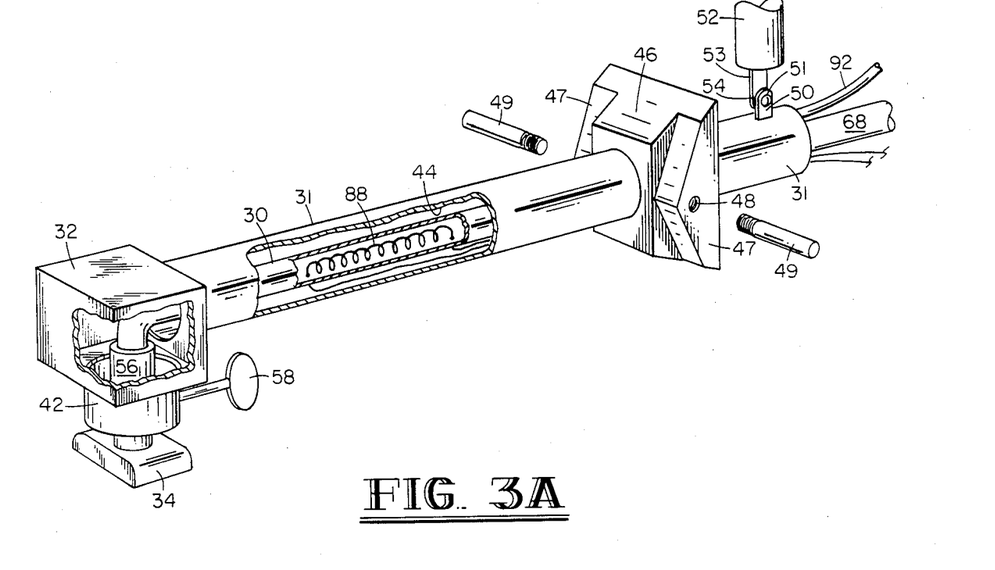
FIG. 3A is a perspective view of the heater arm of the present invention with a partial cut-out.
Figure 3B:
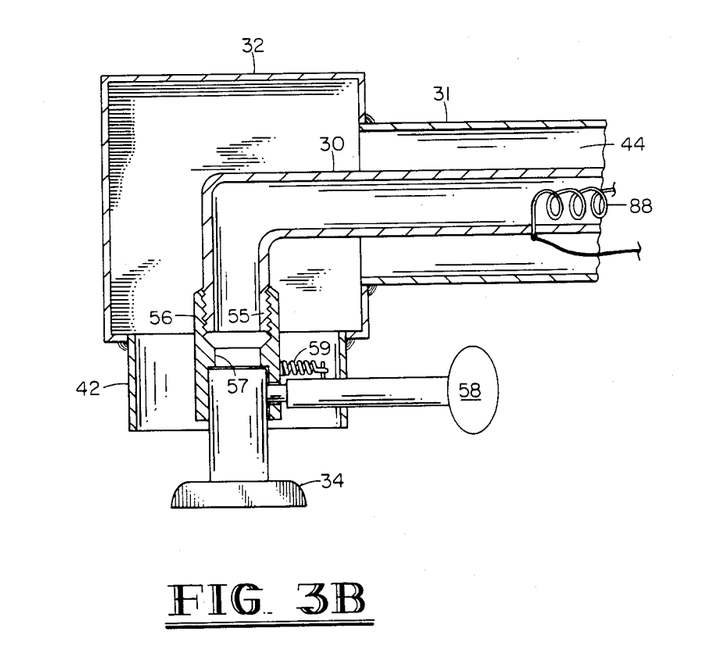
FIG. 3B is a cross-sectional view of the heater head shown in FIG. 3A.

With further reference to FIGS. 2 and 3, the novel and advantageous air flow of the present invention may be clearly seen. Heater arm 18 consists of two concentric tubes 30 and 31 which terminate in heater head 32. Hot air, typically about 500° F., is directed through the innermost tube 31 and downward through heater head 32. The hot air then passes through a nozzle 34, preferably made of clear quartz, which affords the operator maximum visibility. Lying below nozzle 34 is an electrical component 36 which has been previously soldered to a printed circuit board or other substrate 38. Nozzle 34 directs the hot air only at the leads or castellations 40 of component 36. A vacuum shroud or collar 42 lies above and surrounds the heat zone around component 36. Shroud 42 also surrounds nozzle 34, and is attached to heater head 32, forming an extension of outermost tube 31. The space 44 between inner and outer tubes 30 and 31, and hence the space between shroud 42 and nozzle 34, is in fluid communication with a vacuum source (not shown). In this manner, the hot air is immediately removed from the heat zone, leaving adjacent components cool. Space 44 simultaneously serves as an insulative barrier protecting the operator from the dangerously hot temperature of inner tube 30.

The details of the construction of heater arm 18 are shown in FIGS. 3A and 3B. Heater arm 18 is connected to support member 16 by means of pivot block 46. Pivot block 46 is generally cubic in shape, having a hole therein for receiving outer tube 31, and also having two ears 47. Ears 47 in turn have threaded apertures 48 which receive pins 49, about which block 46 pivots. Pins 49 are mounted to support member 16 by any convenient means, such as welding. Heater arm 18 extends completely through block 46, and terminates within support member 16. Inner tube 30 terminates at, and is connected to, upper heater conduit 68. Outer tube 31 is sealed off except for a port connecting space 44 to vacuum conduit 92. A tongue 50, having a hole 51, is mounted on tube 31 near its end for coupling with a pneumatically-controlled actuating cylinder 52. Air cylinder 52 is fixedly attached to the interior of support member 16, and has an actuator arm 53 having a hole 54 therein near its distal end. Hole 54 is aligned with hole 51, and a nut and bolt or other fastener means is used to couple air cylinder 52 to tongue 50. Thus, when actuator arm 53 extends (by action of the solenoid valve described below), heater arm 18 pivots about pins 49 and heater head 32 is raised above the work area. Similarly, when actuator arm 53 retracts, heater head 32 is lowered directly above the component to be reflowed. The inventors have found that the air cylinder manufactured by Festo Corp. of Hauppauge, N.Y. is satisfactory for these purposes.

A cross-sectional view of heater head 32 is shown in FIG. 3B. Inner tube 30 has a ninety degree bend within head 32, and terminates in an open end 55 threadingly engaged with a coupling socket 56. Socket 56 has an inner annular flange 57 for limiting the distance which nozzle 34 may be inserted into socket 56. Socket 56 also has a hole therein for receiving the distal end of a knob 58, which serves to hold nozzle 34 in place. Spring 59 keeps knob 58 in forcible contact with nozzle 34.

The pneumatics of the system may be understood with reference to FIG. 4. A source of pressure, such as a conventional pump (not shown), is connected to input port 60. A minimum pressure of 45 psig is recommended for the embodiment herein disclosed. Input port 60 then branches into two conduits 62 and 64, which may be constructed of plastic or any other suitable material. Driver conduit 62 leads to a solenoid valve 66 which controls the pneumatically actuated cylinder 52 described above which raises and lowers heater arm 18. Solenoid valve 66 simply reverses air flow to cylinder 52. Festo Corp. also manufactures a suitable solenoid valve which may be used with cylinder 52.

Heater conduit 64 further branches into upper and lower heater conduits 68 and 70. Upper and lower heater conduits 68 and 70 each pass through flow meters 72 and 74. Flow meters are known in the art, and the inventor has found that the flow rate meters manufactured by the Dwyer Instruments, Inc., of Michigan City, Ind., are adequate for purposes of the present invention. Those meters measure gas flow from 0–100 SCFII (standard cubic feet per hour). The amount of air passing through flow meters 72 and 74 is controlled by flow rate knobs 76 and 78, and may be monitored by the position of floater balls 80 and 82.

Lower heater conduit 70 continues to lower heater tube 83. Lower heater element 84 lies within tube 83 and raises the temperature of the air therein to between 400° F. to 600° F. Lower heater element 84 is powered by a standard 120 volt AC source of electricity. This hot air is then directed out lower vent 86, which pierces surface 26, toward the bottom portion of PCB 38. Lower heater element 84 is thus controlled independently from upper heater element 88, and serves to pre-heat PCB 38 so as to avoid thermal shock. Failure to pre-heat board 38 could result in delamination, cracking, or other damage thereto.

Upper heater conduit 68 continues toward heater arm 18 where it merges with inner tube 30. As explained above, upper heater element 88 resides within inner tube 30 and is also powered by a standard source of electricity. Upper heater element 88 heats the air within tube 30 to a temperature of between 300° F. and 600° F. The heated air flows out inner tube 30 and nozzle 34 toward component 36.

The heated air is conducted away from component 36 by the negative pressure existing around vacuum shroud 42. A vacuum source (not shown) is connected to output port 90 of vacuum conduit 92. Vacuum conduit 92 is in fluid communication with outer tube 31, space 44, and thus the space between vacuum shroud 42 and nozzle 34. The vacuum source should be able to provide a negative pressure of around 25 inches of mercury.

Figure 5:
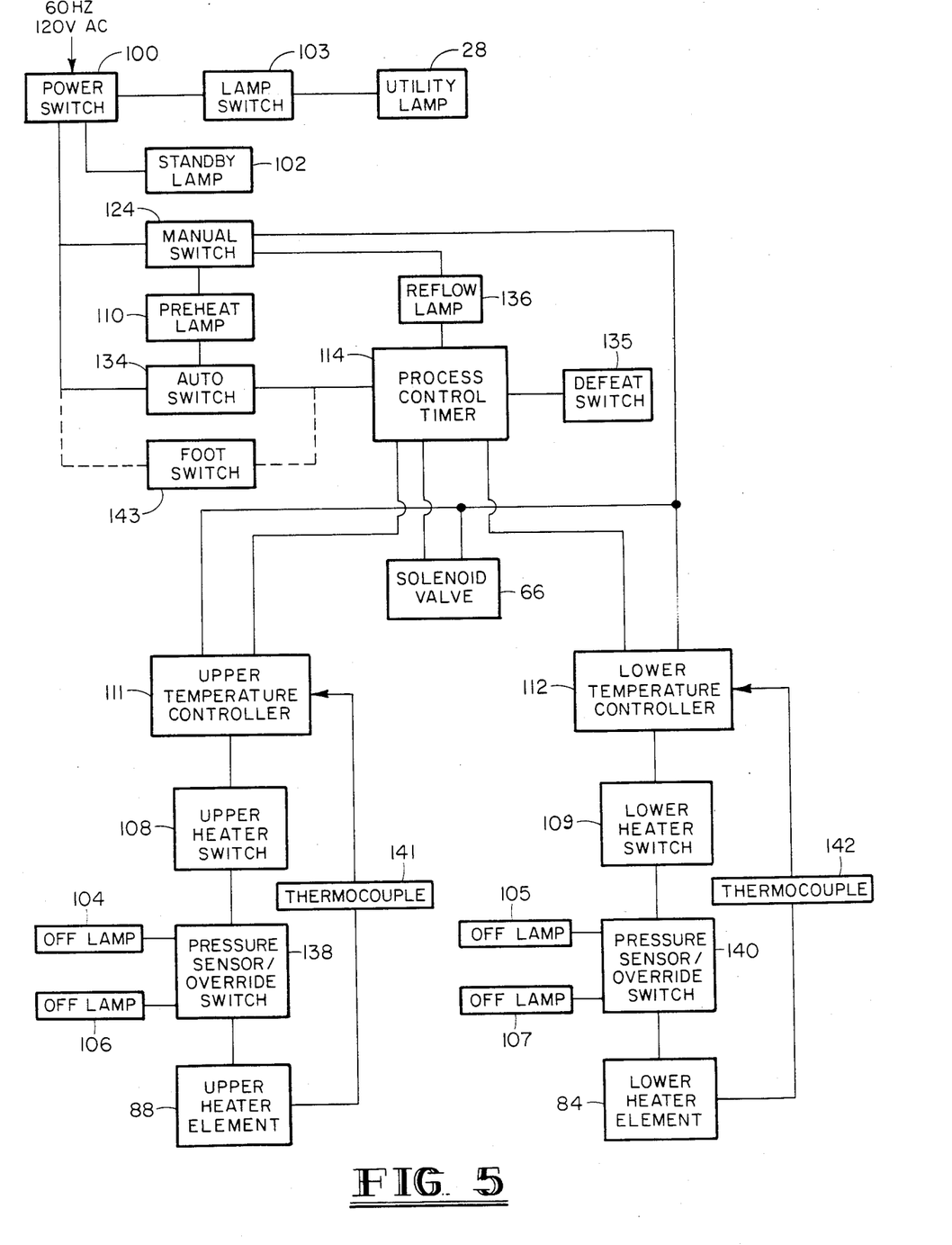
FIG. 5 is a block diagram showing the electrical system of the present invention.

With reference now to FIG. 5, the electrical system of repair terminal 10 is explained. A standard electricity source of 120 volts AC, 60 Hz., is supplied to repair terminal 10 via power switch 100. Electricity is fed directly to the utility lamp 28, and standby lamp 102 mounted on control panel 22. Power is also fed to the upper and lower heater elements 88 and 84 through either manual switch 124 or automatic switch 134. When either of these switches is depressed, preheat lamp 110 begins to glow.

While manual switch 124 provides a direct source of power to the heaters, automatic switch 134 routes power through process control timer 114. In either case, power is actually supplied to the heaters through upper and lower temperature controllers 111 and 112. Controllers 111 and 112 monitor the temperatures of their respective heaters with a closed-loop system having individual thermocouples 141 and 142 mounted adjacent to the heaters. Electrical power to the heaters is further limited by upper and lower heater switches 108 and 109, and by pressure sensor/override switches 138 and 140. Upper and lower heater switches 108 and 109 merely provide a means for disabling one heater but still using the other. For example, lower heater 84 should not be used in reflow where sensitive components are mounted on both sides of PCB 38. Pressure sensor/override switches 138 and 140 are diaphragm-type switches which insure that heaters 88 and 84 will not melt down in the absence of airflow.

Figure 6:
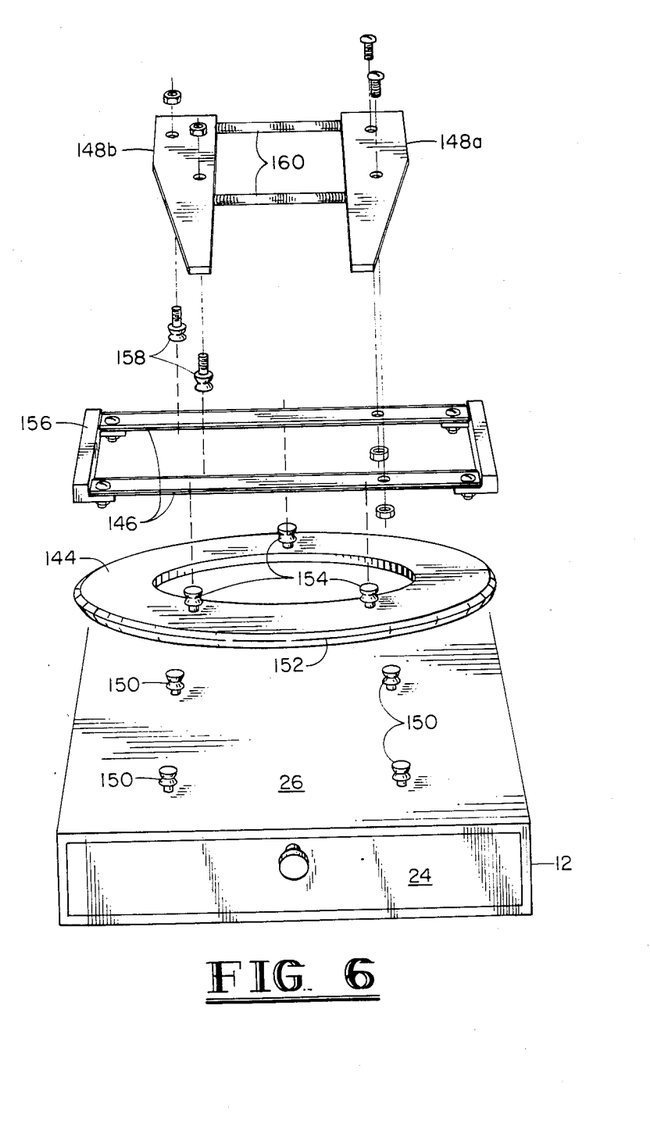
FIG. 6 is an exploded perspective view showing the theta-adjust workholder of the present invention.

FIG. 6 depicts the theta-adjust workholder 14 of the present invention. Workholder 14 is generally comprised of three parts: rotating table 144, rails 146, and jaws 148. Rotating table 144 is generally circular, and has a central void to allow air flow from vent 86 to the underside of PCB 38. Table 144 is mounted on upper surface 26 of base 12 by means of indented bearings 150. Bearings 150 have a concave working surface so as to mate with the beveled edge 152 of table 144. In the preferred embodiment, four such bearings are symmetrically mounted onto surface 26, table 144 being interposed between them. Thus table 144 lies slightly above surface 26, and is free to rotate 360°.

Three more bearings 154, identical to bearings 150, are mounted on the upper surface of table 144. Bearings 154 serve as guides for rails 146. Rails 146 are each beveled on both sides, and are held together by brackets 156. Rails 146 are free to slide back and forth within bearings 154, which contact the outer edges of rails 146.

Rails 146 further provide a mounting platform for jaws 148. Jaw 148a is attached to rails 146 at a fixed location using bolts, rivets, or other means. Jaw 148b, however, is slidably mounted on rails 146 by means of another pair of indented bearings 158. Bearings 158 are bolted onto jaw 148b, and fit inside rails 146. Finally, two springs 160 connect jaws 148 and bias them toward one another. In this manner, any size PCB may be held by jaws 148 simply by pulling jaw 148b away from jaw 148a, inserting the PCB, and releasing jaw 148b.

The function of workholder 14 is easily seen. First of all, by proper placement of PCB 38 in jaws 148, the forward-backward position of the defective component 36 may be adjusted. Then, by sliding rails 146 along bearings 154, the left-right position may be adjusted. Finally, if the component has been mounted skew with respect to the PCB edges, table 144 may be rotated so as to align the cutouts of nozzle 34 with the leads 40 of component 36. Thus, workholder 14 provides adjustment in the x- and y-axes, and in the theta-angle orientation.

Although repair terminal 10 was initially created for reworking surface mounted components, it should be understood that it may also be used on conventional lead-through components. Special nozzle configurations, such as those disclosed in the patents discussed in the Background of the invention, may be preferable to other nozzles used on surface mounted components. The special nozzles may be adapted for use with repair terminal 10.

OPERATION

Repair terminal 10 has been designed to simplify rework operation whereby an operator with a minimal amount of technical training will be able to repair and replace defective electrical components. The following steps should be followed in the rework operation.

First, the various systems of repair terminal 10 should be activated. The vacuum source should be connected to output port 90 and turned on. The pressure source should be connected to input port 60 and turned on. Main power switch 100 should then be depressed. In the preferred embodiment, each of the control switches contain light sources therein which will illuminate the switch when it is in the depressed position to insure proper functioning of that switch. A check should be made that each switch lights up when it is depressed.

After turning on the main power, standby indicator 102 will begin to glow. Lamp switch 103 may also be depressed at this time to provide adequate illumination of the work area.

After the pressure source has been activated, flow control knobs 76 and 78 may be manipulated to allow the passage of air to upper and lower heater elements 88 and 84. At first, red "off" lamps 104 and 105 will glow to indicate that no gas is flowing through conduits 68 and 70; after control knobs 76 an 78 have been adjusted, green "on" lamps 106 and 107 will turn on, and lamps 104 and 105 will turn off, to indicate that gas is properly flowing.

Upper and lower heaters 88 and 84 may be energized by depressing upper and lower heater switches 108 and 109. The heaters will not be energized unless green lamps 106 and 107 are illuminated to prevent heater meltdown in the absence of air flow. Pre-heat lamp 110 will glow when the heaters are operational. Upper and lower heater controllers 111 and 112 will display the temperature of the gas as it exits nozzle 34 and vent 86, respectively. Process control timer 114 will display the time interval to be used for automatic reflow. Heater arm 18 will move to the raised position if not already in that position.

The next step is to select a nozzle 34 for the particular component 36 which is to be reworked. The appropriate nozzle is determined by matching the cutouts at the bottom portion of the nozzle with the leads 40 of component 36. The chosen nozzle 34 is placed in heater head 32 by pulling knurled knob 58 located behind heater head 32. Nozzle 34 is then inserted into heater head 32 as far as it can go, and knob 58 is released.

The temperature controls of the system should be adjusted if values other than the stored default values are to be used. To view the present setpoint values for each of the heaters, asterisk ("*") button 116 (upper heater) or 118 (lower heater) should be depressed. To change the setpoints, asterisk button 116 or 118 should be depressed while simultaneously pressing either of the arrow buttons 120 or 122. Up arrow button 120 will increase the setpoint, and down arrow button 122 will decrease the setpoint.

The component 36 to be replaced must now be aligned with nozzle 34. The PCB 38 is positioned in workholder 14 by sliding open spring-actuated jaws 148. Table 144 is rotated to properly orient component 36 with respect to the theta angle. Rails 146 are then moved left or right until component 36 lies directly under nozzle 34.

The component is now ready to reflow. The reflow operation may be accomplished manually or by using the automatic control feature of repair terminal 10. In either case, a small amount of flux should first be applied to the leads 40 of component 36.

To begin manual reflow, manual cycle switch 124 is depressed. Heater arm 18 will then lower, and the temperature of the gas exiting nozzle 34 will increase to the setpoint value. When the solder around leads 40 begins to melt, manual cycle switch 124 should again be depressed, causing heater arm 18 to rise. The component 36 can now be removed with tweezers or a vacuum pencil.

In automatic reflow, the amount of time that heater arm 18 is in the lowered position is present by the operator. This is accomplished by first depressing SET button 126 on process control timer 114. The time is then entered using up arrow buttons 128 or down arrow buttons 130. In the preferred embodiment, the time period is entered to four significant digits, and there are four pairs of up and down arrow buttons 128 and 130, one pair for each significant digit. An appropriate process control timer may be purchased from Eagle Signal Co., of Austin, Tex., under the brand name CAL 9000. After the desired time appears in the display, the operator should press ENT button 132. Process control timer 114 is now programmed for the time interval shown on the display.

Next, automatic cycle switch 134 is depressed. This causes heater arm 18 to descend, and begins to ramp up the temperature in upper heater element 88. A footswitch 143 may be provided to actuate the automatic cycle, leaving the operator's hand free to work on removal of the component.

Heater arm 18 will continue to eject hot gas for the duration of the time interval programmed in process control timer 114. If for some reason the operation wishes to abort the automatic cycle, defeat switch 135 should be depressed. At the end of the automatic cycle, heater arm 18 will rise, and green reflow lamp 136 will glow for approximately 10 seconds. Component 36 should be removed before lamp 136 turns off, as attempted removal after the solder cools may result in delamination of PCB 38. Care should be exercised to lift the component directly upwards, so as not to smear the solder between adjacent pads.

After removal of the defective component, a new component may be installed. The new component should be properly oriented on PCB 38, and leads 40 should be fluxed. The alignment of leads 40 with the pads on PCB 38 should be checked. The new component may be reflowed using either the manual or automatic cycle. After reflow has occurred and heater arm 18 rises, the component should not be touched for at least 10 to 15 seconds, as the solder will remain molten for this period of time. The repaired circuit board may now be reinstalled in its parent machine, or used in the manufacture of a new device.

Although the invention has been described with reference to specific embodiments, this description is not meant to be construed in a limiting sense. Various modifications of the disclosed embodiment, as well as alternative embodiments of the invention will become apparent to persons skilled in the art upon reference to the description of the invention. It is therefore contemplated that the appended claims will cover such modifications that fall within the true scope of the invention.

I claim:

1. A repair terminal for reflowing an electrical component on a circuit board comprising:
   support means;
   a heater arm member attached to said support means;
   means for aligning said heater arm member with said component;
   means for ejecting hot gas from said heater arm member; and
   means for removing said hot gas from a heat zone around said component, thereby minimizing damage to adjacent components, said removing means also providing an insulative barrier about said heater arm member.

2. The repair terminal of claim 1 wherein:
   said heater arm member further comprises inner and outer tubes, each having first and second open ends, said inner tube being mounted within said outer tube, forming an annular space therebetween; and said hot gas is ejected from said inner tube, and is removed through said space between said inner and outer tubes, said space thereby forming an insulative barrier about said inner tube.

3. The repair terminal of claim 2 wherein:

said first end of said inner tube is in fluid communication with a nozzle member, said nozzle member directing said hot gas onto said component;

said first end of said outer tube is in fluid communication with a vacuum shroud, said shroud surrounding said nozzle member;

said second end of said inner tube is in fluid communication with a source of pressurized gas; and said space between said inner and outer tubes is in fluid communication with a source of negative pressure, said source of negative pressure being coupled to said heater arm member near said second end of said outer tube, thereby setting up a circulation pattern about said component in which said hot gas is immediately removed from said heat zone after impinging upon said component.

4. The repair terminal of claim 3 wherein said second end of said inner tube is connected to said pressure source by an upper heater conduit, said upper heater conduit having a flow meter therein for regulating gas flow therethrough.

5. The repair terminal of claim 4 further comprising:

an upper heater element mounted within said inner tube for heating said pressurized gas, for connection to an external power source; and upper heater control means for controlling temperature of said hot gas by regulating said upper heater element.

6. The repair terminal of claim 5 wherein said upper heater control means comprises:

a thermocouple attached to said upper heater element;

processor means for monitoring said thermocouple and regulating electrical current travelling to said upper heater element according to a setpoint temperature value;

means for inputting said setpoint temperature value in said processor means; and means for displaying said setpoint temperature value.

7. The repair terminal of claim 3 further comprising lower heater means for preheating said circuit board.

8. The repair terminal of claim 7 wherein said lower heater means comprises:

a lower heater conduit having first and second ends, said first end being in fluid communication with said pressure source;

said lower heater conduit having a flow meter therein for regulating gas flow therethrough;

a lower heater tube having first and second ends, said first end of said lower heater tube being in fluid communication with said second end of said lower heater conduit;

a lower heater element located within said lower heater tube for connection to an external power source; and a vent in fluid communication with said second end of said lower heater tube, said vent directing hot gas on a side of said circuit board opposite the side on which said component is mounted.

9. The repair terminal of claim 8 having lower heater control means comprising:

a thermocouple connected to said lower heater element:

processor means for monitoring said thermocouple and regulating electrical current travelling to said lower heater element according to a setpoint temperature value;

means for inputting said setpoint temperature value in said processor means; and means for displaying said setpoint temperature value.

10. The repair terminal of claim 3 further comprising means for raising and lowering said heater arm above said component.

11. The repair terminal of claim 10 wherein said means for raising and lowering said heater arm comprises:

a pivot block having a hole therethrough for receiving said heater arm, said block being pivotally mounted to said support means.

an air driven cylinder having an actuator arm, said cylinder being vertically disposed, and said actuator arm being retracted when air flows through said cylinder in a first direction, and being extended when air flows therethrough in a second direction;

means for linking said actuator arm to said second end of said outer tube;

means for supplying pressurized air to said cylinder;

a solenoid valve for controlling said supplying means, said solenoid valve having a first position corresponding to said first direction of air flow through said cylinder, and having a second position corresponding to said second direction of air flow through said cylinder; and first switch means for activating said solenoid valve.

12. The repair terminal of claim 11 further comprising process control means for automatically controlling movement of said heater arm.

13. The repair terminal of claim 12 wherein said process control means comprises:

second switch means;

processor means electrically connected to said second switch means and said solenoid valve, whereby activation of said switch means causes said solenoid valve to switch to said first position, thereby lowering said heater arm, said processor means then causing said solenoid valve to switch to said second position, after a preset time interval has elapsed, thereby raising said heater arm;

keypad means for inputting said preset time interval in said processor means.

14. The repair terminal of claim 3 wherein said aligning means comprises:

a horizontal table member rotatably mounted to said support means;

rail means slidably mounted to said table member; and a pair of jaw members adjustably mounted to said rail means.

15. The repair terminal of claim 14 wherein:

said table member is substantially circular and has a beveled edge, said table member being mounted to said support means by a first plurality of bearings each having a concave working surface, said concave surfaces each mating with said beveled edge of said table member; and said rail means comprises two parallel rail members being mounted to said table member by a second plurality of bearings each having a concave working surface, said concave surfaces of said second plurality of bearings mating with an outer edge of one of said two rail members.

16. A repair terminal for removing or replacing a defective electrical component on a circuit board, comprising:
   a base;
   a means for adjustably holding said circuit board;
   support means extending upwardly from said base;
   a heater arm attached at a first end to said support means, said heater arm disposed above said holding means, having inner and outer tubes, said inner tube disposed within said outer tube, said heater arm terminating at a second end in a heater head, said heater head comprising a nozzle attached to said inner tube, and a vacuum shroud attached to said outer tube, said shroud partially surrounding said nozzle;
   a vacuum source connected to said outer tube at said first end of said heater arm;
   a pressure source connected to said inner tube at said first end of said heater arm;
   means for regulating flow of gas through said inner tube; and
   upper heater means located within said inner tube for heating gas as it passes therethrough.

17. The repair terminal of claim 16 further comprising lower heater means for heating said circuit board from a side of said board opposite the side on which said component is mounted.

18. The repair terminal of claim 17 wherein said lower heater means comprises:
   a lower heater conduit having first and second ends, said first end being in fluid communication with said pressure source;
   said lower heater conduit having a flow meter therein for regulating gas flow therethrough;
   a lower heater tube having first and second ends, said first end of said lower heater tube being in fluid communication with said second end of said lower heater conduit;
   a lower heater element located within said lower heater tube for electrical connection to an external power source; and
   a vent in fluid communication with said second end of said lower heater tube, said vent directing hot gas on a side of said circuit board opposite the side on which said component is mounted.

19. The repair terminal of claim 16 having means for automatically lowering said heater arm immediately above said component for a preset time interval, said automatic means raising said heater arm after said time interval has elapsed.

20. The repair terminal of claim 16 having override means for defeating said upper heater means when no gas is flowing through said inner tube.

21. The repair terminal of claim 18 having override means for defeating said lower heater element when no gas is flowing through said lower heater tube.

22. A repair terminal for reflowing a component to or from a substrate, comprising:
   a base;
   a support member attached to said base;
   a housing attached to said support member;
   an adjustable workholder mounted on an upper surface of said base, said workholder having spring-mounted jaws for holding said substrate, and having means for slidable adjustment along two horizontal, perpendicular axes, and having means for rotatable adjustment in a horizontal plane;
   a pressure source;
   a lower heater conduit having first and second ends, and having a first flow meter therein for regulating flow therethrough, said first end of said lower heater conduit connected to said pressure source;
   a lower heater tube having first and second ends, said first end of said lower heater tube being connected to said second end of said lower heater conduit;
   a lower heater element mounted within said lower heater tube for heating gas flowing therethrough;
   means for regulating said lower heater element;
   a vent having first and second ends, said vent piercing said upper surface of said base, said first end of said vent connected to said second end of said lower heater tube, and said second end of said vent being open and located adjacent a side of said circuit board opposite the side on which said component is mounted;
   a heater arm having first and second ends, and inner and outer tubes, said inner tube lying within said outer tube, forming a first space therebetween;
   a heater head disposed at said first end of said heater arm;
   a nozzle attached to said inner tube proximate said heater head;
   a vacuum shroud attached to said heater head, surrounding said nozzle, forming a second space between said shroud and said nozzle, said second space being in fluid communication with said first space;
   a vacuum source in fluid communication with said first space;
   an upper heater conduit having first and second ends, and having a second flow meter therein for regulating gas flow therethrough, said first end of said upper heater conduit connected to said pressure source, and said second end of said upper heater conduit connected to said inner tube proximate said second end of said heater arm;
   an upper heater element mounted within said inner tube for heating gas flowing therethrough;
   means for regulating said upper heater element;
   an air cylinder located within said support member, attached to said second end of said heater arm, for raising and lowering said heater arm;
   first switch means for actuating said air cylinder;
   process control means for automatically lowering said heater arm immediately above said component for a preset time interval;
   second switch means for activating said process control means; and
   power means for energizing said upper and lower heater elements and said process control means.

23. An adjustable workholder comprising:
   a base;
   a table rotatably mounted to said base;
   first and second parallel rails fixedly attached to one another, and slidably mounted on said table;
   first and second jaws connected by spring means, said jaws mounted on said first and second rails.

24. The workholder of claim 23 wherein:
   said table is essentially circular, having a beveled edge, and is mounted to said base by means of a plurality of indented bearings attached to said base along a circular path, said table being interposed between said bearings, said beveled edge riding in indentations of said bearings; and
   said first jaw is fixedly attached to said first and second rails, and said second jaw is slidably attached to said first and second rails.

* * * * *